United States Patent
Hsieh et al.

(10) Patent No.: US 6,207,515 B1
(45) Date of Patent: Mar. 27, 2001

(54) METHOD OF FABRICATING BURIED SOURCE TO SHRINK CHIP SIZE IN MEMORY ARRAY

(75) Inventors: Chia-Ta Hsieh, Tainan; Jenn Tsao, Taipei; Di-Son Kuo, Hsinchu; Yai-Fen Lin, Taichung; Hung-Cheng Sung, Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/085,611

(22) Filed: May 27, 1998

(51) Int. Cl.[7] .................................................. H01L 21/265
(52) U.S. Cl. ........................................... 438/300; 438/526
(58) Field of Search .................................. 438/524, 526, 438/429, 413, 416, 418, 442, 300, 262

(56) References Cited

U.S. PATENT DOCUMENTS

| | | | |
|---|---|---|---|
| 4,758,531 | * | 7/1988 | Beyer et al. ........................... 438/429 |
| 5,017,977 | | 5/1991 | Richardson ........................... 357/23.5 |
| 5,034,342 | * | 7/1991 | Sidner et al. ......................... 438/429 |
| 5,180,680 | * | 1/1993 | Yang ..................................... 438/259 |
| 5,250,460 | * | 10/1993 | Sparks .................................. 438/429 |
| 5,326,718 | * | 7/1994 | Klose et al. .......................... 438/429 |
| 5,382,534 | | 1/1995 | Sheu et al. ............................. 437/35 |
| 5,384,280 | * | 1/1995 | Aoki et al. ........................... 438/429 |
| 5,422,299 | * | 6/1995 | Neudeck et al. ..................... 438/429 |
| 5,424,231 | * | 6/1995 | Yang ..................................... 439/524 |
| 5,436,190 | * | 7/1995 | Yang et al. ........................... 438/296 |
| 5,460,987 | * | 10/1995 | Wen et al. ............................ 438/589 |
| 5,504,025 | * | 4/1996 | Fong-Chun et al. ................. 438/278 |
| 5,576,567 | | 11/1996 | Mori ..................................... 257/316 |
| 5,602,049 | | 2/1997 | Wen et al. .............................. 437/52 |
| 5,627,393 | | 5/1997 | Hsu ...................................... 257/331 |
| 5,668,031 | * | 9/1997 | Hsue et al. ........................... 438/275 |
| 5,877,067 | * | 3/1999 | Kimura et al. ....................... 438/438 |
| 5,882,972 | * | 3/1999 | Hong et al. ........................... 438/524 |
| 5,889,314 | * | 3/1999 | Hirabayashi et al. ............... 438/438 |
| 5,937,297 | * | 8/1999 | Peidous ................................ 438/270 |
| 5,949,116 | * | 9/1999 | Wen ..................................... 438/262 |

* cited by examiner

*Primary Examiner*—Savitri Mulpuri
(74) *Attorney, Agent, or Firm*—George O. Saile; Stephen B. Ackerman

(57) ABSTRACT

A method is provided for forming buried source line in semiconductor devices. It is known in the art to form buried contacts on the surface of a semiconductor substrate. The present invention discloses a method of fabricating a semiconductor device, particularly a memory cell, having both the source region and the source line buried within the substrate. The source line is formed in a trench in the substrate over the source region. The trench walls are augmented with voltage anti-punch-through protection. The trench also provides the attendant advantages of extended sidewall area, smaller sheet resistance, and yet smaller cell area, therefore, smaller chip size, and faster access time as claimed in the embodiments of this invention. The buried source disclosed here is integrated with source line which is also buried within the substrate.

16 Claims, 3 Drawing Sheets

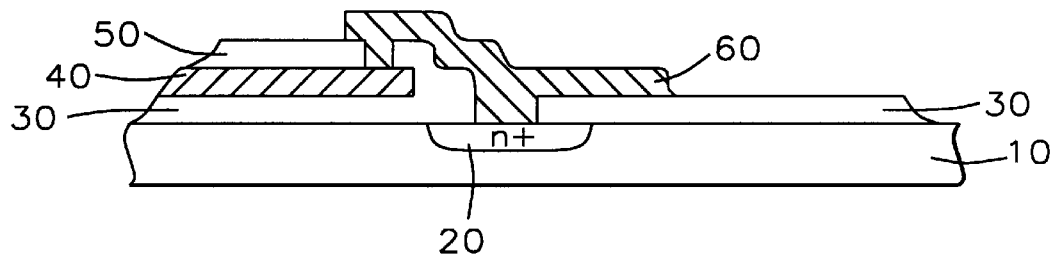
FIG. 1a – Prior Art
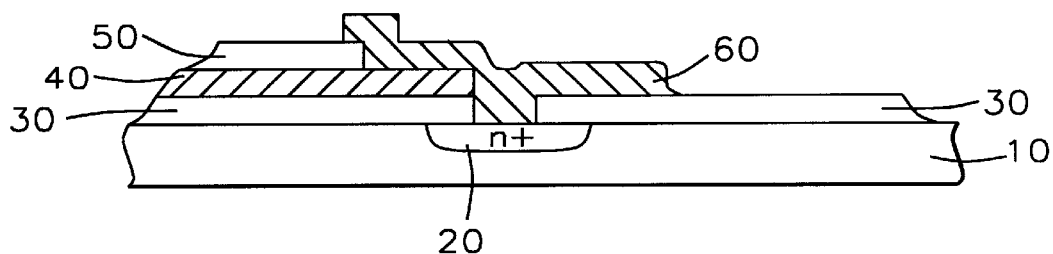
FIG. 1b – Prior Art
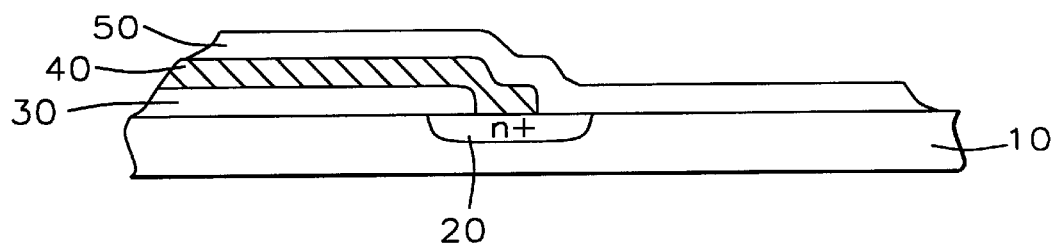
FIG. 1c – Prior Art

METHOD OF FABRICATING BURIED SOURCE TO SHRINK CHIP SIZE IN MEMORY ARRAY

BACKGROUND OF THE INVENTION (1) Field of the Invention

The present invention relates to semiconductor devices and more particularly to a method of forming buried source line in memory cells in order to reduce the size of integrated circuits.

(2) Description of the Related Art

The technological advances in the semiconductor industry are directed towards improvements in performance, that is speed, and productivity, that is, less unitary cost. By the nature of the semiconductor physics and technology, and fortunately so, the improvements in one feed the other. Thus, reduction in the size of the elements in integrated circuits increase the packing density of elements which in turn help reduce the size of the chip in which the circuits reside. Alternatively, more circuits can be packed in the same area chip, which together help improve productivity in semiconductor manufacturing. At the same time, as the circuits are packed closer together, signal propagation, that is, communication through shorter distances between circuits becomes faster, and, therefore, the overall performance is greatly improved.

When silicon-gate technology was developed, a means had to be provided for making contact between the polysilicon layer and the single-crystal substrate. In early silicon-MOS circuits, such contacts were made by using either a metal link to interconnect the polysilicon and the substrate as shown in prior art FIG. 1a, or by the so-called butted contacts as shown in FIG. 1b. In FIG. 1a, the metal link (60), usually aluminum, is formed over a substrate (10) having a polysilicon layer (40) separated from the substrate and the metal layer by means of first and second dielectric silicon oxide layers (30) and (50), respectively, thus providing the contact between the polysilicon layer and the substrate.

With the butted contact, polysilicon (poly) is aligned with the active-device area (20) to which the contact will be established. This is done by patterning the polysilicon film after it has been deposited. After insulating layer (30) has been deposited to cover the poly, a contact window that overlaps both the poly and the substrate is opened, exposing both poly layer (40) and substrate (10). Metal is deposited to fill the contact, thereby electrically linking the two regions together (FIG. 1b). The butted contact conserves area by eliminating the space required between the separate contact windows when the approach of FIG. 1a is used.

The butted contact of FIG. 1b was later replaced by buried contact shown in FIG. 1c, because more area is conserved as shown in the same Figure. With the buried contact, direct contact is made between polysilicon and the substrate, eliminating the need for a metal link to form the contact over region (20). In this structure, a window is opened in the first dielectric layer (30), which is now a thin gate oxide, over the substrate area (20) at which the contact is to be made. When the polysilicon is subsequently deposited, it is in direct contact with the substrate in these opening but is isolated from the substrate by the gate and field oxides everywhere else (not shown). As it will be known by those skilled in the art, an ohmic contact is formed at the ploy-substrate Si interface by the diffusion into the substrate of dopant present in the polysilicon. A second dielectric (50) is then deposited to cover the contact as shown in FIG. 1c. The structure is called a "buried contact" because a metal layer can cross over the area of the substrate where a contact has been established without making an electrical connection to it. As will be apparent from the structure, therefore, the use of buried contacts in silicon-gate technology proves an important benefit in that it makes available an additional level of interconnect on the integrated circuit.

As memory and logic devices are scaled down in size by taking advantage of buried elements such as buried source and drain regions with smaller line widths and pitches, newer challenges arise. For example, as line pitches decrease, the buried line sheet resistance increases. Moreover, as the line sheet resistance increase, memory and logic circuit performance decrease. These relationships present the process designer with a trade off problem between smaller buried conductive regions and better circuit performance.

Smaller buried conductive regions create other process related problems, as described in U.S. Pat. No. 5,382,534. Buried conductive lines are designed with higher impurity concentrations to lower the line resistivity. During oxidation processes, the highly doped line areas oxidize at a higher rate than the lower doped surrounding areas. This enhanced oxidation rate is a function of the doping level of the highly doped line areas, but with the usual doping levels, the doped areas oxidize about four times as fast as the undoped areas. This enhanced oxidation creates surface topology steps between the non-doped device areas and the doped line area. The surface topology can cause yield problems in subsequent layers. The topology can cause photolithography depth of field and focusing problems.

Sheu, et al in U.S. Pat. No. 5,382,534 disclose a method for forming buried conductive regions in a trench that provides a smooth surface topology, smaller devices and improved device performance. The buried regions have two conductive regions, the first on the trench sidewalls, the second at the bottom of the trench. In addition, two buried layers are formed between adjacent buried conductive regions: a threshold voltage layer near the substrate surface and an anti-punchthrough layer formed at approximately the same depth as the conductive regions on the trench bottoms. The first conductive region and the anti-punchthrough layer have the effect of increasing the punchthrough voltage without increasing the threshold voltage. The first and second regions also lowers the resistivity of the buried regions, according to Sheu, et al, allowing the use of smaller line pitches and therefore smaller devices.

Wen, et al, in U.S. Pat. No. 5,602,049 disclose a method of fabricating a buried structure SRAM cell having ultra-high density. Here, higher packing density is made possible by eliminating the field oxide and hence bird's beak encroachment between active regions.

Richardson, on the other hand, discloses in U.S. Pat. No. 5,017,977 dual EPROM cells formed on the walls of a trench etched deep into a substrate. The trenches are then filled with doped polycrystalline semiconductor material. The doping of this semiconductor material diffuses into the silicon substrate during subsequent processing steps. This diffusion forms the drain of the floating gate field effect transistor. Then, by etching back the polysilicon and the silicon dioxide on the sidewalls, defining the conductive line at the bottom of the trench, growing gate oxide on the sides of the trench, depositing a second polysilicon layer and etching the same to provide polysilicon sidewalls, growing an interlevel dielectric, depositing another layer of polysilicon on the surface of the substrate to form gate lines of the cell, etching the latter polysilicon layer to remove the areas between the formed word lines, and further etching to remove interlevel dielectric and floating gate polysilicon between the EEPROM cells, vertical floating gate field effect transistors are fabricated on either side of a trench, bit lines are formed between and at the bottom of trenches which are perpendicular to the word lines over the trenches.

Another vertical channel device having buried source is described by Hsu in U.S. Pat. No. 5,627,393. In this approach, two levels of trenches are formed. The lower level trenches are etched through a well region into the buried source region and then filled with polysilicon to form gate electrodes. Drain regions are formed adjacent to the trenches by depositing, and etching back a second polysilicon layer and then ion implanting to form drain regions. Two sets of contact upper trenches are formed through silicon oxide layers subsequently deposited. The contact trenches are filled with tungsten to establish contact with drain and source regions.

Still another type of vertical memory cell array is disclosed by Mori in U.S. Pat. No. 5,576,567 using a vertical floating that can be fabricated with reduced cell areas and channel length. The array can be made contactless, half-contact or full contact, trading speed for increased cell area. A still different vertical channel device having buried source is shown by Hsu in U.S. Pat. No. 5,627,393.

The present invention discloses a different method of fabricating a semiconductor device, in particular, a memory cell, having both the source region and the source line buried within the substrate. The source line is formed in a trench in a substrate over the source region. This provides the attendant advantages of extended sidewall area, smaller sheet resistance, punch-through protection and yet smaller cell area, therefore, smaller chip size, and faster access time as claimed in the embodiments of this invention. The buried source disclosed here is integrated with source line which is also buried within the substrate.

SUMMARY OF THE INVENTION

It is therefore an object of this invention to provide a method of fabricating buried source in a memory cell.

It is another object of this invention to provide a method of fabricating buried source lines with relatively low sheet resistance.

It is yet another object of this invention to provide a method for reducing chip size.

It is also an overall object of this invention to provide a method for improving performance of integrated circuits, and productivity in the manufacture of semiconductor devices.

These objects are accomplished by providing a silicon substrate having a plurality of active and field areas defined; forming a pad oxide layer over the substrate; depositing a layer of nitride over said pad oxide layer; forming a patterned photoresist mask over said layer of nitride, wherein said patterns correspond to source regions formed in said active areas of said silicon substrate; etching said layer of nitride and pad oxide underlying said patterned photoresist mask; etching further to form a trench with internal surfaces in said silicon substrate; removing said photoresist mask; growing surface oxide on said internal surfaces of said trench; etching portions of said surface oxide on portions of said internal surfaces of said trench; performing selective epitaxial growth (SEG) in said trench; forming an integrated source and source line in said SEG in said trench by performing ion implantation with nitride layer as a mask; removing said layer of nitride and pad oxide layer; and using conventional techniques for forming and completing a semiconductor device.

BRIEF DESCRIPTION OF THE DRAWINGS

FIG. 1a shows an intervening space in the forming of a contact with a metal link between a conductive layer and a substrate of prior art.

FIG. 1b shows the closure of the intervening space of FIG. 1 in the forming of a contact with a butted-contact between a conductive layer and a substrate of prior art.

FIG. 1c shows the forming of a direct contact with a buried contact between a conductive layer and a substrate of prior art.

FIGS. 2a–2f show the top view of a substrate at selected process steps, while FIGS. 3a–3f show the cross section of the same substrate at the same location corresponding to a given process step. Thus:

FIGS. 2a and 3a show the forming of a pad oxide and a layer of nitride on a semiconductor, according to this invention.

FIGS. 2b and 3b show the patterning of a photoresist layer and the subsequent etching of openings in the nitride and pad oxide layers of FIGS. 2a and 2b, according to this invention.

FIGS. 2c and 3c show the etching of trenches in the substrate of FIGS. 2b and 3b through the openings in the nitride and pad oxide layers, and the subsequent growing of surface oxide on the internal surfaces of the trench of this invention.

FIGS. 2d and 3d show selective removal of the surface oxide of FIGS. 2c and 2d at the bottom and upper sidewalls of the trench of this invention.

FIGS. 2e and 3e show the filling of the trench of FIGS. 2d and 3d by using selective epitaxial growth (SEG) process of to this invention.

FIGS. 2f and 3f show, after the removal of the pad oxide and nitride layers in FIGS. 2e and 3e, the completion of the forming of a buried source line integrated with the source regions in the substrate of this invention

DESCRIPTION OF THE PREFERRED EMBODIMENTS

Figure 2A:
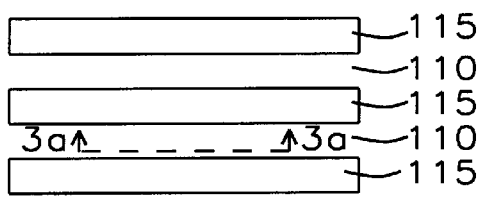
FIGS. 2a–2f and 3a–3f show schematically steps of forming buried source lines in a semiconductor substrate according to this invention. Specifically.

Referring now to the drawings, in particular to FIGS. 2a–2f, and 3a–3f, there are shown schematically steps of forming buried source lines in a semiconductor substrate. FIGS. 2a–2f show the top view of substrate (100) at selected process steps, while FIGS. 3a–3f show the cross section of the same substrate at the same location corresponding to a given process step.

In FIG. 2a, substrate (100), preferably silicon, is provided with active device regions, and passive field regions already defined as is well known in the art. Active regions are denoted by reference numeral (110), and field regions by (115). Cross-section (3a–3a) is a cut across representative active region (110) in FIG. 2a, and is shown in FIG. 3a.

Figure 3A:
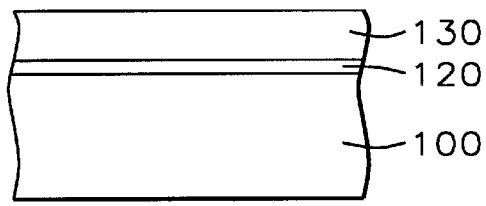

As shown in FIG. 3a, a pad oxide (120) is first formed on substrate (100). The pad oxide (120) can be formed by a thermal oxidation process at a temperature between about 850° C. to 950° C. Alternatively, the pad oxide can be formed by an atmospheric or low pressure chemical vapor deposition process as is well known. It is preferred that the pad oxide is formed by thermal oxidation process. The pad oxide layer (120) has a thickness between about 250 to 400 angstroms (Å). A layer of silicon nitride (130) is next deposited over pad oxide layer (120) as shown in the same FIG. 3a. The silicon nitride layer is formed with low pressure chemical vapor deposition (LPCVD) at a temperature between about 650° C. to 750° C. by reacting dichlorosilane ($SiCl_2H_2$) with ammonia ($NH_3$).

Figure 2B:
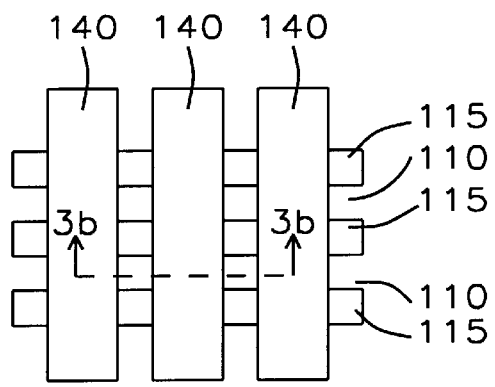
Figure 3B:
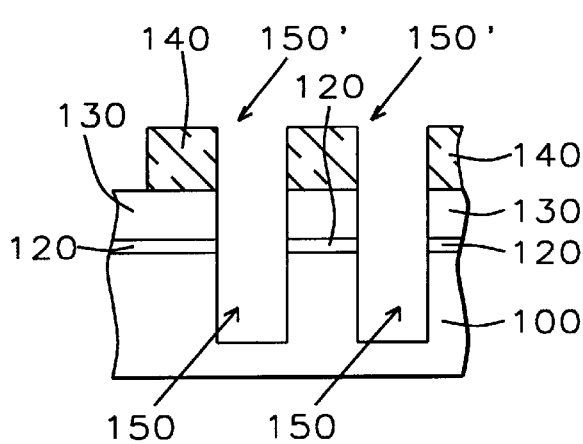
Figure 2C:
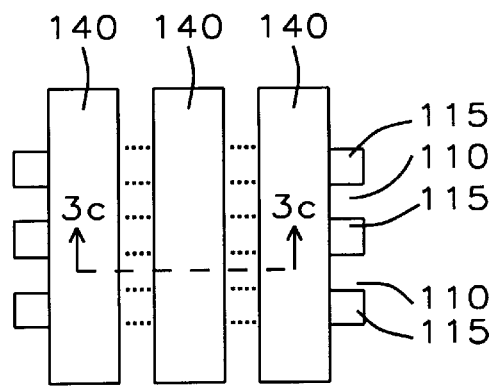

Following the forming of pad oxide, and nitride layers, a photoresist layer (140) is formed over nitride layer (130), as shown in FIG. 3b, having a line pattern corresponding to the source regions (not shown) that are formed in active regions (110) shown in FIG. 2b. The nitride and pad oxide layers, (130) and (120), respectively, are etched through the pattern openings (150') in resist (140) as shown in the cross-sectional view of FIG. 3b. The nitride etch can be accomplished with etch recipe comprising Ar, $CHF_3$, $C_4F_8$ at flow rates between about 60 to 160, 20 to 160 and 5 to 25 sccm, respectively, while pad oxide can be etched using $CHF_3$ and $O_2$ plasma with a power between about 1500 to 2000 watts.

Now, as the main feature and key spirit of the present invention, the openings (150') are then transferred into the substrate by etching silicon using a dry etch, such as a plasma etch using $Cl_2$ and He. The resulting trenches (150) in the substrate as shown in FIG. 2b preferably have a depth between about 1500 to 4000 Å, and a width between about 2000 to 5000 Å. After the forming of trenches (150), photoresist layer (140) is removed.

Figure 3C:
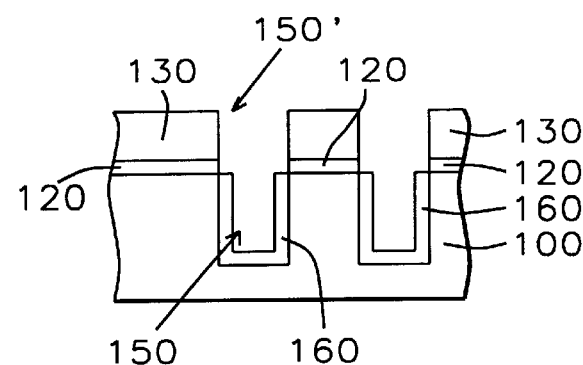
Figure 2D:
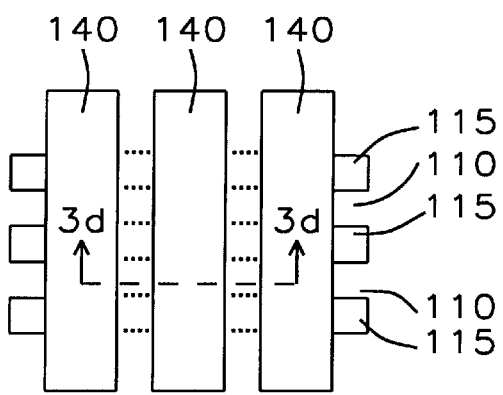

A critical step then follows to grow oxide, referred to as surface oxide (160) here, on the inside surfaces, including the walls and the bottom of trench (150) as shown in FIG. 3c. It is to be noted here that surface oxide (160) will serve as anti-punch-through layer on the sidewalls of trench source line that is being formed. The surface oxide growth is accomplished thermally at a temperature between about 900 to 1000° C. It is preferred that the thickness of surface oxide (160) is between about 80 to 200 Å.

Figure 3D:
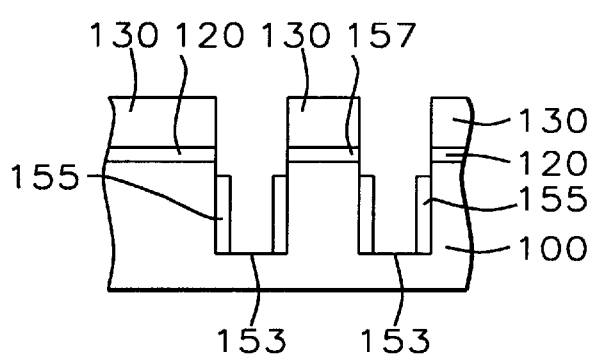
Figure 2E:
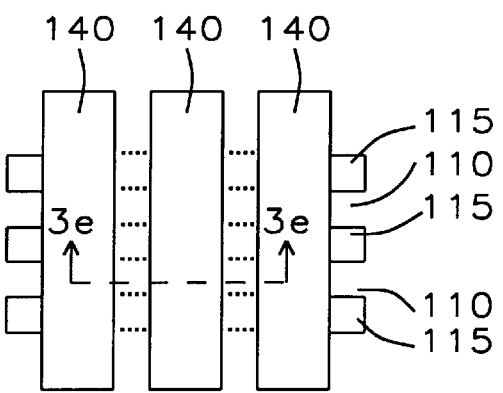

Using the patterned nitride layer (130) as a mask, the surface oxide so formed is partially removed from the bottom (153) of the trench, as well as the upper portions (157) of sidewall (155) shown in FIG. 3d. The partial removal of surface oxide (160) from the bottom and sidewalls of the trench is accomplished with dry etch. It is preferred that the "mouth" so formed by partial removal of surface oxide from the upper portions (157) of trench (150) has a lip depth (157) between about 100 to 250 Å below the level of the surface of substrate (100).

At the next important step, trench (150) is filled a material to serve as a buried source line. Selective epitaxial growth (SEG) is preferred in the presently disclosed embodiment because this also produces an isolation structure with no attendant encroachment or bird's beak problems, as will be recognized by those skilled in the art. This, in itself, improves packing density, or, alternatively, provides a larger source contact area at the same packing density. In addition, SEG fills the trench (150) to the top of substrate (100) evenly, without the need for overfill and etchback, as would be required with polysilicon refill, for example. This is shown in FIG. 3e where SEG (170) fills to the substrate level (175).

SEG fill of trench (150) can be accomplished through hydrogen reduction of tetrachloride ($SiCl_4$), tricholorosilane ($SiHCl_3$), or dichlorosilane ($SiH_2Cl_2$). It will be appreciated by those skilled in the art that the removal of surface oxide not only from the bottom (155) but also from the mouth (157) of trench (150) provides an additional nucleation site to assure no void formation and a positive growth stop when reaching the substrate level (175).

Figure 3E:
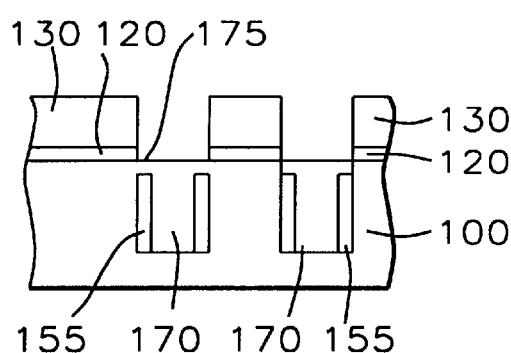
Figure 2F:
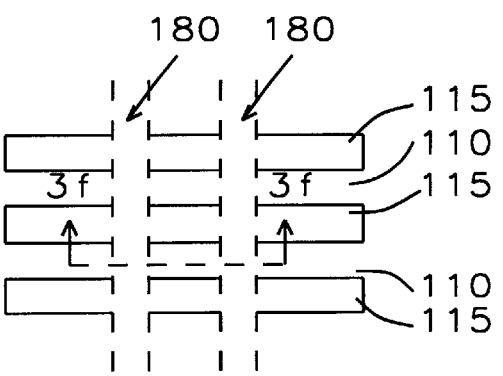
Figure 3F:
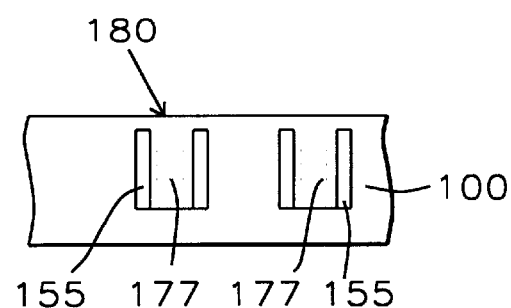

Still using the nitride layer (130) as a mask, N-type ions are implanted vertically through openings (150'), thus forming a conductive buried source line (177) as shown in FIG. 3e. The ion implantation is accomplished preferably with arsenic, As, at a dosage level between about $4 \times 10^{15}$ to $8 \times 10^{15}$ atoms/$cm^2$ and energy between about 30 to 50 KEV. As a final step, nitride layer and pad oxide are removed as shown in FIG. 3f, and hence the forming of the buried source line (177) as integrated with the underlying source region (not shown) is completed. A top view of the buried source lines is shown as phantom lines (180) in FIG. 2f. The fabrication of the final device is completed using conventional semiconductor processes.

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as, for example, for fabricating buried lines over drain and other regions in the substrate, as well.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming buried source in a memory array comprising the steps of:

providing a silicon substrate having a plurality of active and field areas defined;

forming a pad oxide layer over said substrate;

depositing a layer of nitride over said pad oxide layer;

forming a patterned photoresist mask over said layer of nitride, wherein said patterns correspond to source regions formed in said active areas of said silicon substrate;

etching said underlying layer of nitride and said pad oxide through openings in said patterned photoresist mask;

etching further to form a trench with internal surfaces comprising sidewalls and a bottom surface in said silicon substrate;

removing said photoresist mask;

growing surface oxide on said internal surfaces of said trench;

etching portions of said surface oxide on portions of said internal surfaces, including upper portions of said sidewalls and said bottom surface of said trench;

performing selective epitaxial growth (SEG) in said trench;

forming a source line in said SEG by implantation, wherein said source line integrated with any one of said source regions in said, SEG in said trench over said active regions;

removing said layer of nitride and pad oxide layer; and using conventional techniques for forming and completing a semiconductor device.

2. The method of claim 1, wherein said forming a pad oxide layer is accomplished by thermal growth at a temperature between about 850 to 950° C.

3. The method of claim 2, wherein said pad oxide layer has a thickness between about 250 to 400 angstroms (Å).

4. The method of claim 1, wherein said depositing a layer of nitride is accomplished with LPCVD.

5. The method of claim 4, wherein the thickness of said layer of nitride is between about 1500 to 2500 Å.

6. The method of claim 1, wherein said photoresist mask has a thickness between about 1 to 1.2 micrometers ($\mu$m).

7. The method of claim 1, wherein said etching said layer of nitride and pad oxide is accomplished with dry etch.

8. The method of claim 1, wherein said etching further to form a trench in said silicon substrate is accomplished with dry etch.

9. The method of claim 1, wherein said trench with internal surfaces has a depth between about 1500 to 4000 Å, and a width between about 2000 to 5000 Å.

10. The method of claim 1, wherein said internal surfaces of said trench comprise sidewalls and a bottom surface.

11. The method of claim 1, wherein said growing surface oxide on said internal surfaces of said trench is accomplished by thermal growth at a temperature between about 900 to 1000° C.

12. The method of claim 10, wherein said surface oxide formed on said sidewalls in said trench form anti-punchthrough walls with a thickness between about 80 to 200 Å.

13. The method of claim 1, wherein said etching portions of said surface oxide is accomplished with dry etch.

14. The method of claim 1, wherein said performing selective epitaxial growth (SEG) in said trench is accomplished by chemical vapor deposition.

15. The method of claim 1, wherein said forming an integrated source is accomplished by implanting As ions in the upper portions of said SEG with a dosage between about $4 \times 10^{15}$ to $8 \times 10^{15}$ atoms/cm$^2$ and at an energy between about 30 to 50 KEV.

16. The method of claim 1, wherein said integrated source line is formed in said SEG to a depth between about 1500 to 4000 Å.

* * * * *